United States Patent
Lin

(10) Patent No.: US 9,170,596 B2
(45) Date of Patent: Oct. 27, 2015

(54) INTEGRATED CIRCUITS HAVING CASCODE TRANSISTOR

(71) Applicant: TAIWAN SEMICONDUCTOR MANUFACTURING COMPANY, LTD., Hsinchu (TW)

(72) Inventor: Yvonne Lin, Saratoga, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/301,409

(22) Filed: Jun. 11, 2014

(65) Prior Publication Data

US 2014/0285255 A1    Sep. 25, 2014

Related U.S. Application Data

(62) Division of application No. 13/282,836, filed on Oct. 27, 2011, now abandoned.

(51) Int. Cl.
| | |
|---|---|
| *G05F 1/10* | (2006.01) |
| *H03K 3/01* | (2006.01) |
| *G05F 3/24* | (2006.01) |
| *H01L 25/03* | (2006.01) |

(52) U.S. Cl.
CPC ............ *G05F 3/247* (2013.01); *H01L 25/03* (2013.01)

(58) Field of Classification Search
CPC ......... G05F 3/262; G05F 3/242; G05F 3/205; G05F 1/465; G11C 5/147; H03F 1/302; H03F 1/301; H03F 1/306; H03F 2200/18; H03F 3/505; H03F 3/1935

USPC ........... 327/543, 427, 530, 534; 330/296, 300
See application file for complete search history.

(56) References Cited

U.S. PATENT DOCUMENTS

| | | | |
|---|---|---|---|
| 5,847,591 A | 12/1998 | Schnell | |
| 6,087,894 A * | 7/2000 | Barrett et al. | 327/543 |
| 6,144,218 A | 11/2000 | Smith et al. | |
| 6,188,270 B1 * | 2/2001 | Boerstler | 327/543 |
| 6,211,659 B1 * | 4/2001 | Singh | 323/315 |
| 6,603,339 B2 * | 8/2003 | Atallah et al. | 327/175 |
| 7,349,190 B1 * | 3/2008 | Maheedhar et al. | 361/92 |
| 7,541,871 B2 * | 6/2009 | Willassen et al. | 330/257 |

(Continued)

OTHER PUBLICATIONS

Zeghbroeck, B. "Chapter 7: MOS Field-Effect-Transistors," 2007, <http://ecee.colorado.edu/~bart/book/book/chapter7/ch7_4.htm>.

(Continued)

*Primary Examiner* — Lincoln Donovan
*Assistant Examiner* — Thomas Skibinski
(74) *Attorney, Agent, or Firm* — Hauptman Ham, LLP

(57) ABSTRACT

An integrated circuit includes a first circuit. The first circuit includes a first transistor having a first dopant type. The first circuit further includes a first cascode transistor having the first dopant type, wherein the first cascode transistor connected in series with the first transistor. The first circuit further includes a second transistor having a second dopant type opposite to the first dopant type, wherein the second transistor is connected in series with the first transistor. The first circuit includes a second cascode transistor having the second dopant type, wherein the second cascode transistor is connected in series with the second transistor. The integrated circuit further includes a first bias circuit configured to adjust a threshold voltage of at least one of the first cascode transistor or the second cascode transistor.

20 Claims, 7 Drawing Sheets

(56) References Cited

U.S. PATENT DOCUMENTS

2003/0222698 A1 12/2003 Khieu et al.
2010/0182059 A1 7/2010 Mai

OTHER PUBLICATIONS

Li, H., et al., "CMOS Amplifier Design," Analog Circuits and Devices, 2006.

* cited by examiner

INTEGRATED CIRCUITS HAVING CASCODE TRANSISTOR

PRIORITY CLAIM

The present application is a divisional of U.S. application Ser. No. 13/282,836, filed Oct. 27, 2011, which is incorporated herein by reference in its entirety.

TECHNICAL FIELD

The present disclosure relates generally to the field of semiconductor integrated circuits, and more particularly, to integrated circuits with cascode transistors.

BACKGROUND

The semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area. The scale down of features of integrated circuits has been implemented in various applications, e.g., digital circuits, analog circuits, and mixed-signal circuits.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
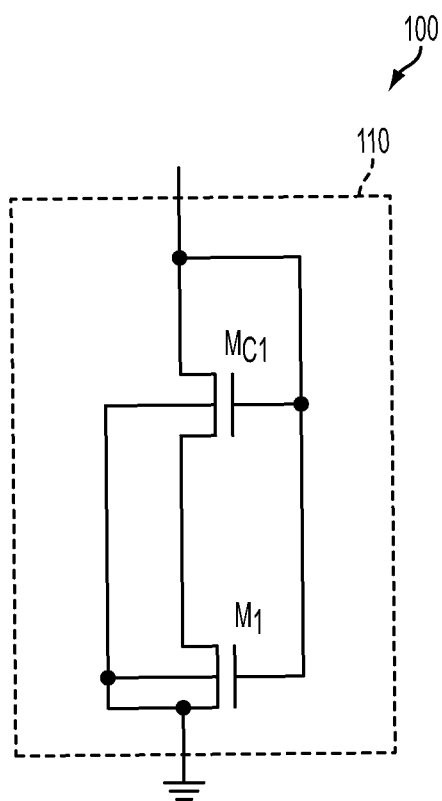
FIG. 1A is a schematic drawing of an exemplary integrated circuit including an N-type cascode transistor.

In analog circuits, cascode technology is deployed to enhance electrical performances. In cascode technology, a cascode transistor is electrically coupled with a transistor in series. As the cascode transistor is operated as a diode having a low input resistance to the transistor, the voltage gain of the transistor becomes small, such that the bandwidth of the analog circuit is increased.

One cascode technique is to electrically connect a gate and a drain of the cascode transistor together. A gate and a drain of the transistor are electrically connected to each other. The gate of the cascode transistor is electrically isolated from the gate of the transistor. During the operation, the cascode transistor and the transistor are both operated in a saturation mode. In such a configuration, the supply voltage is designed to be larger than a sum of threshold voltages of the cascode transistor and the transistor. This configuration of the cascode transistor and the transistor makes the voltage headroom small.

Another cascode technique is to supply a bias voltage to the gate of the cascode transistor to enhance the voltage headroom. To provide a desired bias voltage, the bias circuit electrically coupled with the gate of the cascode transistor is complicated and may be difficult to design.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition of reference numerals indicates the same element contained in different embodiments and does not in itself dictate a relationship between the various embodiments and/or configurations discussed.

FIG. 1A is a schematic drawing of an exemplary integrated circuit including an N-type cascode transistor. In FIG. 1A, an integrated circuit 100 includes an analog circuit 110. In some embodiments, the analog circuit 110 is an operational amplifier, a constant-gm bias circuit, a bandgap reference circuit, a current mirror, an analog to digital converter (ADC), a digital to analog converter (DAC), a pump circuit, a multiplexer, or one of other analog circuitries.

Referring to FIG. 1A, the analog circuit 110 includes a transistor $M_1$. The transistor $M_1$ is an N-type transistor as shown in FIG. 1A. The integrated circuit 100 includes at least one cascode transistor, e.g., cascode transistor $M_{C1}$ that is electrically coupled with the transistor $M_1$ in a series fashion. A drain and a gate of the cascode transistor $M_{C1}$ are electrically coupled with a gate of the transistor $M_1$ of the analog circuit 110. In some embodiments, a source and a bulk of the transistor $M_1$ are electrically coupled with a bulk of the cascode transistor $M_{C1}$ and electrically grounded.

During an operation, the cascode transistor $M_{C1}$ is operated in a saturation mode or a sub-threshold mode. The transistor $M_1$ is operated in a saturation mode. By operating the cascode transistor $M_{C1}$ in a saturation mode or a sub-threshold mode, the voltage headroom between the drain of the cascode transistor $M_{C1}$ and a supply voltage becomes larger. Additionally, the gates of the cascode transistor $M_{C1}$ and the transistor $M_1$ are electrically coupled with the drain of the cascode transistor $M_{C1}$. No bias circuit is electrically coupled to a bulk of the cascode transistor $M_{C1}$ and configured to provide a bias to adjust the operation mode of the cascode transistor $M_{C1}$. As a result, the design of the integrated circuit 100 is simplified. The area that is assigned to accommodate the bias circuit is saved.

In some embodiments, the cascode transistor $M_{C1}$ is operated in a sub-threshold mode, and the transistor $M_1$ is operated in a saturation mode. To achieve the operation, the voltage differential ($V_{GSC1}$) between the gate and the source of the cascode transistor $M_{C1}$ is less than the threshold voltage ($V_{THC1}$) of the cascode transistor $M_{C1}$. The threshold voltage ($V_{THC1}$) of the cascode transistor $M_{C1}$ is less than the threshold voltage ($V_{TH1}$) of the transistor $M_1$. The relationship among the voltage differential $V_{GSC1}$ and the threshold voltages $V_{THC1}$ and $V_{TH1}$ can be shown as below:

$$V_{GSC1} < V_{THC1} < V_{TH1}$$

In some embodiments, the threshold voltage ($V_{THC1}$) of the cascode transistor $M_{C1}$ being less than the threshold voltage ($V_{TH1}$) of the transistor $M_1$ allows a channel length of the cascode transistor $M_{C1}$ to be designed shorter than a channel length of the transistor $M_1$. In some embodiments, a channel width of the cascode transistor $M_{C1}$ is designed to be wider than a channel width of the transistor $M_1$. In other embodiments, the cascode transistor $M_{C1}$ is a native transistor and the transistor $M_1$ is not a native transistor. For example, the threshold voltage ($V_{THC1}$) of the cascode transistor $M_{C1}$ is around 0, and the threshold voltage ($V_{TH1}$) of the transistor $M_1$ is higher than 0. In still other embodiments, the cascode transistor $M_{C1}$ is a low threshold voltage (LVT) transistor or an ultra-low threshold voltage (ULVT) transistor. For example, the cascode transistor $M_{C1}$ is an N-type LVT cascode transistor. The P-type dopant concentration in the channel region of the cascode transistor is lower than that of the transistor.

Figure 1B:
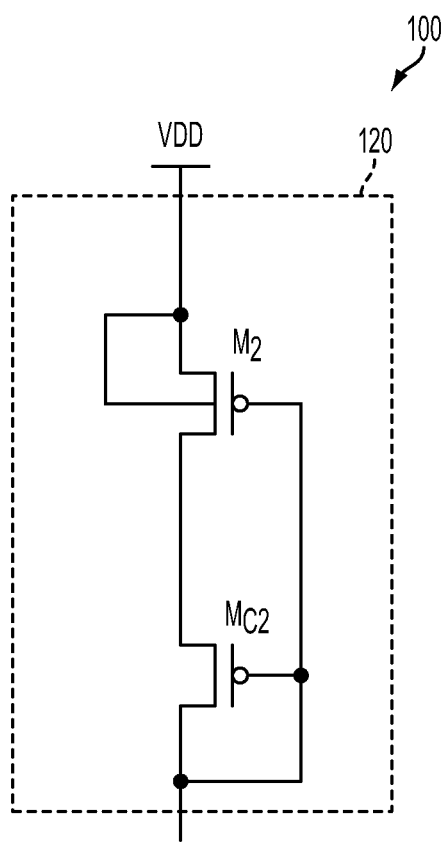
FIG. 1B is a schematic drawing of an exemplary integrated circuit including a P-type cascode transistor.

FIG. 1B is a schematic drawing of an exemplary integrated circuit including a P-type cascode transistor. In FIG. 1B, the integrated circuit 100 includes an analog circuit 120. In some embodiments, the analog circuit 120 is an operational amplifier, a constant-gm bias circuit, a bandgap reference circuit, a current mirror, an analog to digital converter (ADC), a digital to analog converter (DAC), a pump circuit, a multiplexer, or one of other analog circuitries.

Referring to FIG. 1B, the analog circuit 120 includes a transistor $M_2$. The transistor $M_2$ is a P-type transistor as shown in FIG. 1B. The integrated circuit 100 includes at least one cascode transistor, e.g., cascode transistor $M_{C2}$ that is electrically coupled with the transistor $M_2$ in a series fashion. The cascode transistor $M_{C2}$ is a P-type cascode transistor. A drain and a gate of the cascode transistor $M_{C2}$ are electrically coupled with a gate of the transistor $M_2$ of the analog circuit 120. In some embodiments, a source and a bulk of the transistor $M_2$ are electrically coupled to each other and with a supply voltage $V_{DD}$.

As noted, the cascode transistor $M_{C2}$ is operated in a saturation mode or a sub-threshold mode. The transistor $M_2$ is operated in a saturation mode. By operating the cascode transistor $M_{C2}$ in a saturation mode or a sub-threshold mode, the voltage headroom of the analog circuit 120 becomes larger. Additionally, the gates of the cascode transistor $M_{C2}$ and the transistor $M_2$ are electrically coupled with the drain of the cascode transistor $M_{C2}$. No bias circuit is electrically coupled with and used to provide a bias to the bulk of the cascode transistor $M_{C2}$ to adjust the operation mode of the cascode transistor $M_{C2}$.

In some embodiments, the cascode transistor $M_{C2}$ is operated in a sub-threshold mode, and the transistor $M_2$ is operated in a saturation mode. To achieve the operation, the absolute value of the voltage differential ($V_{GSC2}$) between the gate and the source of the cascode transistor $M_{C2}$ is less than the absolute value of the threshold voltage ($V_{THC2}$) of the cascode transistor $M_{C2}$. The absolute value of the threshold voltage ($V_{THC2}$) of the cascode transistor $M_{C2}$ is less than the absolute value of the threshold voltage ($C_{TH2}$) of the transistor $M_2$. The relationship among the absolute values of the voltage differential $V_{GSC2}$ and the threshold voltages $V_{THC2}$ and $V_{TH2}$ is shown as below:

$$|V_{GSC2}| < |V_{THC2}| < |V_{TH2}|$$

In some embodiments, the absolute value of the threshold voltage ($V_{THC2}$) of the cascode transistor $M_{C2}$ being less than the absolute value of the threshold voltage ($V_{TH2}$) of the transistor $M_2$ allows a channel length of the cascode transistor $M_{C2}$ to be designed shorter than a channel length of the transistor $M_2$. In some embodiments, a channel width of the cascode transistor $M_{C2}$ is designed to be wider than a channel width of the transistor $M_2$. In some embodiments, the cascode transistor $M_{C2}$ is a native transistor and the transistor $M_2$ is not a native transistor. For example, the absolute value of the threshold voltage ($V_{THC2}$) of the cascode transistor $M_{C2}$ is around 0, and the absolute value of the threshold voltage ($V_{TH2}$) of the transistor $M_2$ is higher than 0. In still some embodiments, the cascode transistor $M_{C2}$ is a low threshold voltage (LVT) transistor or an ultra-low threshold voltage (ULVT) transistor. As noted, the cascode transistor $M_{C2}$ is a P-type LVT transistor. The N-type dopant concentration in the channel region of the cascode transistor is lower than that of the transistor.

Figure 2A:
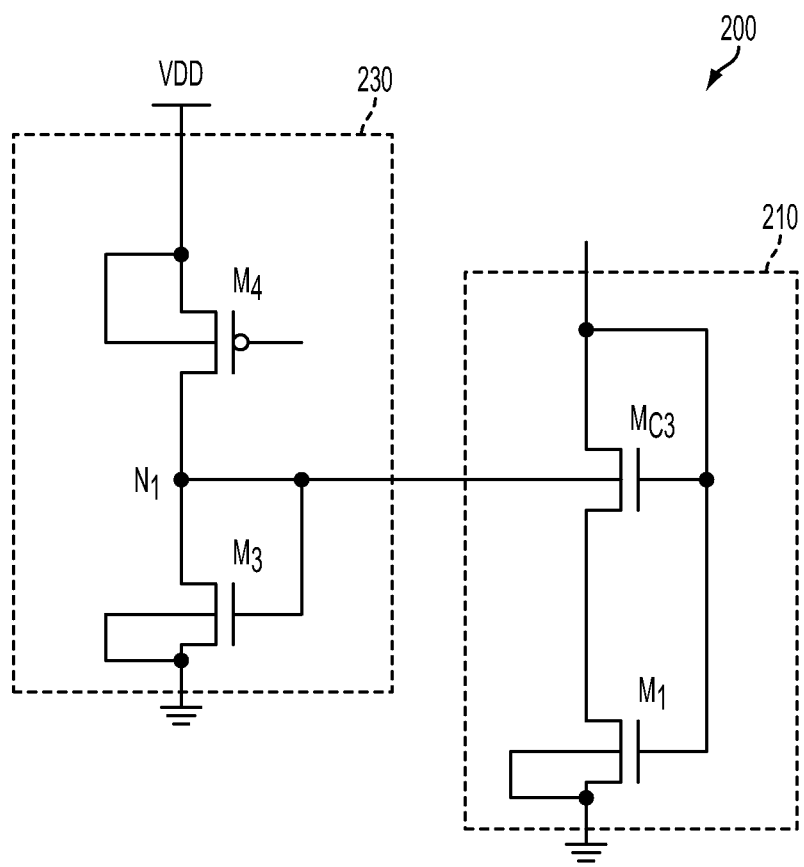
FIG. 2A is a schematic drawing of an integrated circuit including a bias circuit.

FIG. 2A is a schematic drawing of an integrated circuit including a bias circuit. In FIG. 2A, an integrated circuit 200 includes an analog circuit 210, which is the same as or similar to the analog circuit 110 described above in conjunction with FIG. 1A. In FIG. 2A, the analog circuit 210 includes a transistor $M_1$ that is the same as or similar to the transistor $M_1$ described above in conjunction with FIG. 1A. The integrated circuit 200 includes at least one cascode transistor, e.g., cascode transistor $M_{C3}$ that is electrically coupled with the transistor $M_1$ in a series fashion. A drain and a gate of the cascode transistor $M_{C3}$ are electrically coupled with a gate of the transistor $M_1$ of the analog circuit 210.

Referring to FIG. 2A, the integrated circuit 210 includes a bias circuit 230. The bias circuit 230 is electrically coupled with a bulk or a well region of the cascode transistor $M_{C3}$. For example, the cascode transistor $M_{C3}$ is an N-type cascode transistor. The bias circuit 230 is electrically coupled with a P-type well region or a P-type substrate of the cascode transistor $M_{C3}$.

As noted, the cascode transistor $M_{C3}$ is operated in a saturation mode or a sub-threshold mode. The transistor $M_1$ is operated in a saturation mode. To achieve the operation, the threshold voltage ($V_{THC3}$) of the cascode transistor $M_{C3}$ is lower than the threshold voltage ($V_{TH1}$) of the cascode transistor $M_1$.

In FIG. 2A, the bias circuit 230 is configured to lower the threshold voltage ($V_{THC3}$) of the cascode transistor $M_{C3}$. For example, the transistor $M_1$ and the cascode transistor $M_{C3}$ are designed with the similar channel length, channel width, and/or dopant concentration. The bias circuit 230 is configured to provide a voltage to the P-type well region of the cascode transistor $M_{C3}$, such that the threshold voltage ($V_{THC3}$) of the cascode transistor $M_{C3}$ is lower than the threshold voltage ($V_{TH1}$) of the cascode transistor $M_1$.

In some embodiments, the bias circuit 230 includes transistors $M_3$ and $M_4$ that are electrically coupled to each other in a series fashion. The transistor $M_3$ is an N-type transistor and the transistor $M_4$ is a P-type transistor. A gate and a drain of the transistor $M_3$ are electrically coupled with a node $N_1$ between the transistors $M_3$ and $M_4$. The node $N_1$ is electrically coupled with a bulk or a well region of the cascode transistor $M_{C3}$. A bulk and a source of the transistor $M_4$ are electrically coupled to each other and with a supply voltage $V_{DD}$. A gate of the transistor $M_4$ is controlled by a bias voltage that is provided from a bias circuit (not shown).

Figure 2B:
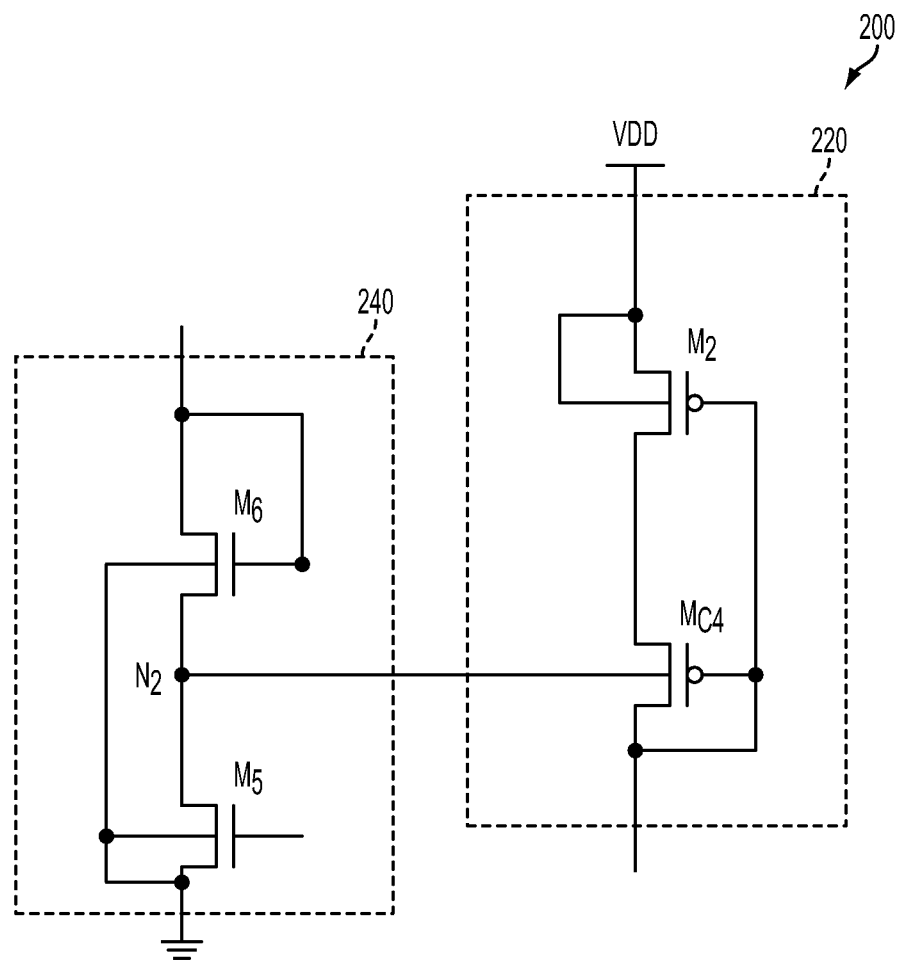
FIG. 2B is a schematic drawing of another exemplary integrated circuit including a bias circuit.

FIG. 2B is a schematic drawing of another exemplary integrated circuit including a bias circuit. In FIG. 2B, an integrated circuit 200 includes an analog circuit 220, which is the same as or similar to the analog circuit 120 described above in conjunction with FIG. 1B. In FIG. 2B, the analog circuit 220 includes a transistor $M_2$ that is the same as or similar to the transistor $M_2$ described above in conjunction with FIG. 1B. The integrated circuit 200 includes at least one cascode transistor, e.g., cascode transistor $M_{C4}$ that is electrically coupled with the transistor $M_2$ in a series fashion. A drain and a gate of the cascode transistor $M_{C4}$ are electrically coupled with a gate of the transistor $M_2$ of the analog circuit 220.

Referring to FIG. 2B, the integrated circuit 220 includes a bias circuit 240. The bias circuit 240 is electrically coupled with a well region of the cascode transistor $M_{C4}$. For example, the cascode transistor $M_{C4}$ is a P-type cascode transistor. The bias circuit 240 is electrically coupled with an N-type well region of the cascode transistor $M_{C4}$.

As noted, the cascode transistor $M_{C4}$ is operated in a saturation mode or a sub-threshold mode. The transistor $M_2$ is operated in a saturation mode. It can be achieved by controlling the threshold voltage ($V_{THC4}$) of the cascode transistor $M_{C4}$ lower than the threshold voltage ($V_{TH2}$) of the cascode transistor $M_2$.

In FIG. 2B, the bias circuit 240 is configured to lower the threshold voltage ($V_{THC4}$) of the cascode transistor $M_{C4}$. For example, the transistor $M_2$ and the cascode transistor $M_{C4}$ have the similar channel length, channel width, and dopant concentration. The bias circuit 240 is configured to provide a voltage to the N-type well region of the cascode transistor $M_{C4}$, such that the threshold voltage ($V_{THC4}$) of the cascode transistor $M_{C4}$ is lower than the threshold voltage ($V_{TH2}$) of the cascode transistor $M_2$.

In some embodiments, the bias circuit 240 includes transistors $M_5$ and $M_6$ that are electrically coupled to each other in a series fashion. The transistors $M_5$ and $M_6$ are N-type transistors. A gate and a drain of the transistor $M_6$ are electrically coupled to each other. A node $N_2$ between the transistors $M_5$ and $M_6$ is electrically coupled with the N-type well region of the cascode transistor $M_{C4}$. In some embodiments, a bulk and a source of the transistor $M_5$ are electrically coupled with a bulk of the transistor $M_6$. A gate of the transistor $M_5$ is controlled by a bias voltage that is provided by a bias circuit (not shown).

Following are various exemplary analog circuits that include at least one cascode transistor described above in conjunction with FIGS. 1A-1B and 2A-2B. It is noted that the applications of the cascode technology of this application are not limited thereto. It is also noted that the configurations of the analog circuits below are merely exemplary. The scope of this application is not limited thereto.

Figure 3:
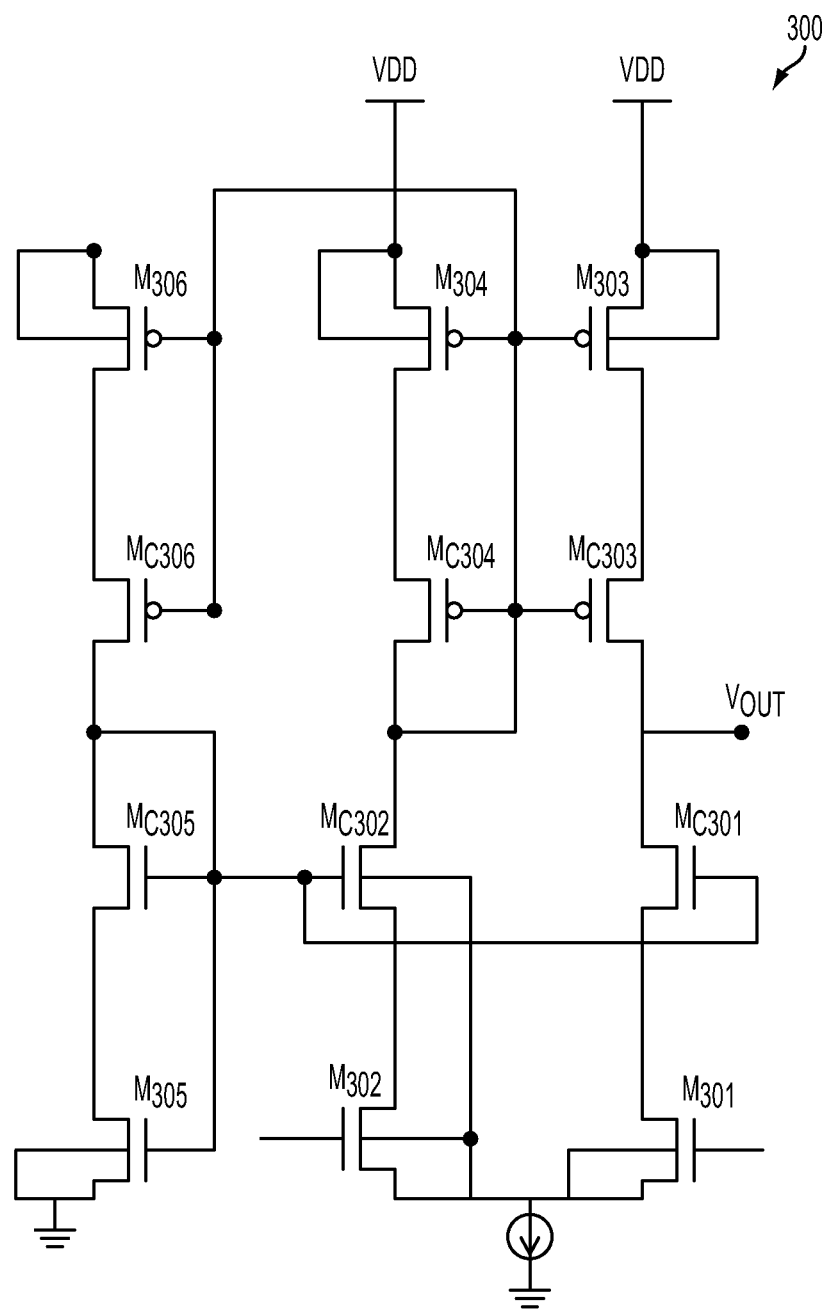
FIG. 3 is a schematic drawing of an exemplary operational amplifier.

FIG. 3 is a schematic drawing of an exemplary operational amplifier. In FIG. 3, an operational amplifier 300 includes transistors $M_{301}$-$M_{306}$ and cascode transistors $M_{C301}$-$M_{C306}$. The transistors $M_{301}$ and $M_{303}$ and the cascode transistors $M_{C301}$ and $M_{C303}$ are electrically coupled to each other in a series fashion between a current source and a supply voltage $V_{DD}$. The transistors $M_{302}$ and $M_{304}$ and the cascode transistors $M_{C302}$ and $M_{C304}$ are electrically coupled to each other in a series fashion between the current source and the supply voltage $V_{DD}$. The transistors $M_{305}$ and $M_{306}$ and the cascode transistors $M_{C305}$ and $M_{C306}$ are electrically coupled to each other in a series fashion. Gates of the transistors $M_{301}$ and $M_{302}$ of the operational amplifier 300 are configured to receive input signals. The operational amplifier 300 outputs at $V_{OUT}$.

In some embodiments, gates of the cascode transistors $M_{C301}$, $M_{C302}$, and $M_{C305}$ and the transistor $M_{305}$ are electrically coupled with each other. Gates of the cascode transistors $M_{C303}$, $M_{C304}$, and $M_{C306}$ and gates of the transistors $M_{303}$, $M_{304}$, and $M_{306}$ are electrically coupled with each other. Bulks of the transistors $M_{301}$ and $M_{302}$ and the bulk of the cascode transistor $M_{C302}$ are electrically coupled with the current source. Bulks of the transistors $M_{303}$ and $M_{304}$ are electrically coupled with the supply voltage $V_{DD}$. A source and a bulk of the transistor $M_{306}$ are electrically coupled with each other. A source and a bulk of the transistor $M_{305}$ are electrically coupled with each other and electrically grounded.

Referring to FIG. 3, the configuration and operation of the transistors $M_{301}$, $M_{302}$ and $M_{305}$ are the same as or similar to those of the transistor $M_1$ described above in conjunction with FIG. 1A. The configuration and operation of the transistors $M_{303}$, $M_{304}$ and $M_{306}$ are the same as or similar to those of the transistor $M_2$ described above in conjunction with FIG. 1B. The configuration and operation of the cascode transistor $M_{C305}$ are the same or similar to those of the cascode $M_{C1}$ described above in conjunction with FIG. 1A. The configuration and operation of the cascode transistor $M_{C304}$ are the same or similar to those of the cascode $M_{C2}$ described above in conjunction with FIG. 1B.

In FIG. 3, configurations of the cascode transistors $M_{C301}$ and $M_{C302}$ are different from the cascode transistor $M_{C305}$. For example, gates of the cascode transistors $M_{C301}$ and $M_{C302}$ are not electrically coupled with the gates of the transistors $M_{301}$ and $M_{302}$, respectively. The cascode transistors $M_{C303}$ and $M_{C306}$ are different from the cascode transistor $M_{C304}$. For example, drains of the cascode transistors $M_{C303}$ and $M_{C306}$ are not electrically coupled with the gates of the cascode transistors $M_{C303}$ and $M_{C306}$, respectively. During the operation, the cascode transistors $M_{C301}$, $M_{C302}$, $M_{C303}$ and $M_{C306}$ are selectively operated in a saturation mode or a sub-threshold mode.

Figure 4:
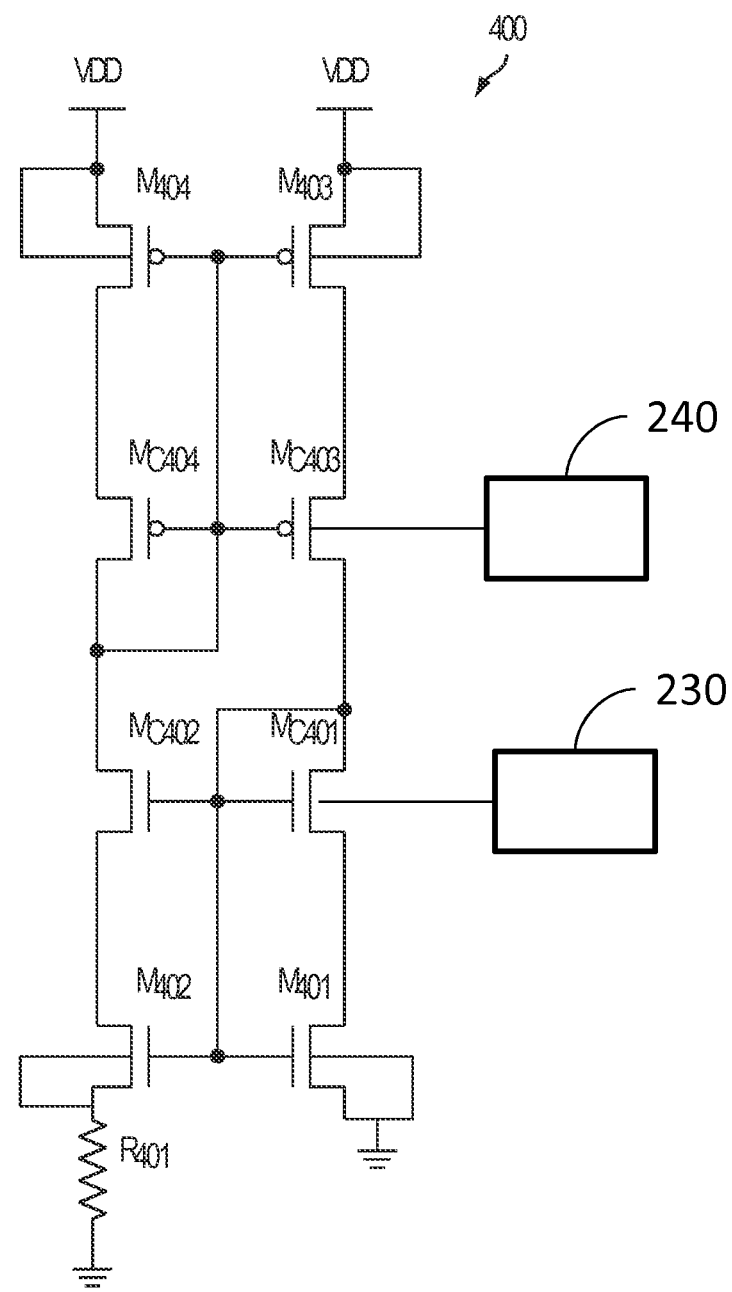
FIG. 4 is a schematic drawing of an exemplary constant gm bias circuit.

FIG. 4 is a schematic drawing of an exemplary constant gm bias circuit. In FIG. 4, a constant gm bias circuit 400 includes transistors $M_{401}$-$M_{404}$ and cascode transistors $M_{C401}$-$M_{C404}$. The transistors $M_{401}$ and $M_{403}$ and the cascode transistors $M_{C401}$ and $M_{C403}$ are electrically coupled to each other in a series fashion between ground and a supply voltage $V_{DD}$. The transistors $M_{402}$ and $M_{404}$ and the cascode transistors $M_{C402}$ and $M_{C404}$ are electrically coupled to each other in a series fashion between a resistor $R_{401}$ and the supply voltage $V_{DD}$.

In some embodiments, gates of the cascode transistors $M_{C401}$ and $M_{C402}$ and gates of the transistors $M_{401}$ and $M_{402}$ are electrically coupled with each other. Gates of the cascode transistors $M_{C403}$ and $M_{C404}$ and gates of the transistors $M_{403}$ and $M_{404}$ are electrically coupled with each other. A bulk and a source of the transistor $M_{401}$ are electrically coupled to each other and electrically grounded. A bulk and a source of the transistor $M_{402}$ are electrically coupled to each other and with the resistor $R_{401}$. Bulks of the transistors $M_{403}$ and $M_{404}$ are electrically coupled with the supply voltage $V_{DD}$.

Referring to FIG. 4, the transistors $M_{401}$ and $M_{402}$ each are the same as or similar to the transistor $M_1$ described above in conjunction with FIG. 1A. The transistors $M_{403}$ and $M_{404}$ each are the same as or similar to the transistor $M_2$ described above in conjunction with FIG. 1B. The configuration and operation of the cascode transistors $M_{C401}$ and $M_{C402}$ are the same or similar to those of the cascode $M_{C1}$ described above in conjunction with FIG. 1A. The configuration and operation of the cascode transistors $M_{C403}$ and $M_{C404}$ each are the same or similar to those of the cascode $M_{C2}$ described above in conjunction with FIG. 1B.

Figure 5:
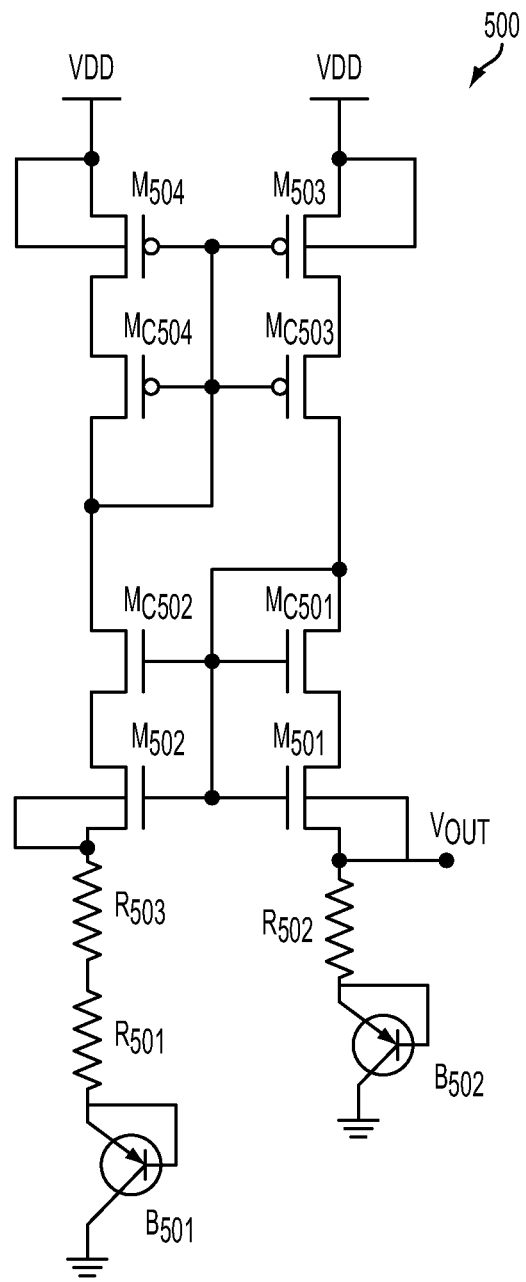
FIG. 5 is a schematic drawing of an exemplary bandgap reference circuit.

FIG. 5 is a schematic drawing of an exemplary bandgap reference circuit. In FIG. 5, a bandgap reference circuit 500 includes transistors $M_{501}$-$M_{504}$, cascode transistors $M_{C501}$-

$M_{C504}$, resistors $R_{501}$-$R_{503}$, and bipolar transistors $B_{501}$-$B_{502}$. The transistors $M_{501}$ and $M_{503}$, the cascode transistors $M_{C501}$ and $M_{C503}$, the resistor $R_{502}$, and the bipolar transistor $B_{502}$ are electrically coupled to each other in a series fashion between ground and a supply voltage $V_{DD}$. The transistors $M_{502}$ and $M_{504}$, the cascode transistors $M_{C502}$ and $M_{C504}$, the resistors $R_{501}$ and $R_{503}$, and the bipolar transistor $B_{501}$ are electrically coupled to each other in a series fashion between ground and the supply voltage $V_{DD}$.

In some embodiments, gates of the cascode transistors $M_{C501}$ and $M_{C502}$ and gates of the transistors $M_{501}$ and $M_{502}$ are electrically coupled with each other. Gates of the cascode transistors $M_{C503}$ and $M_{C504}$ and gates of the transistors $M_{503}$ and $M_{504}$ are electrically coupled with each other. A bulk and a source of the transistor $M_{501}$ are electrically coupled to each other and with the output $V_{OUT}$ of the bandgap reference circuit 500. A bulk and a source of the transistor $M_{502}$ are electrically coupled to each other and with the resistor $R_{503}$. Bulks of the transistors $M_{503}$ and $M_{504}$ are electrically coupled with the supply voltage $V_{DD}$.

Referring to FIG. 5, the transistors $M_{501}$ and $M_{502}$ each are the same as or similar to the transistor $M_1$ described above in conjunction with FIG. 1A. The transistors $M_{503}$ and $M_{504}$ each are the same as or similar to the transistor $M_2$ described above in conjunction with FIG. 1B. The configuration and operation of the cascode transistors $M_{C501}$ and $M_{C502}$ are the same or similar to those of the cascode $M_{C1}$ described above in conjunction with FIG. 1A. The configuration and operation of the cascode transistors $M_{C503}$ and $M_{C504}$ are the same or similar to those of the cascode $M_{C2}$ described above in conjunction with FIG. 1B.

As noted, the descriptions of the analog circuits in conjunction with FIGS. 3-5 are merely exemplary. In some embodiments, the bias circuits 230 and 240 described above in conjunction with FIGS. 2A and 2B are selectively adapted to control the threshold voltages of the cascode transistors described above in conjunction with FIGS. 3-5.

One aspect of this description relates to an integrated circuit including a first circuit. The first circuit includes a first transistor having a first dopant type. The first circuit further includes a first cascode transistor having the first dopant type, wherein the first cascode transistor connected in series with the first transistor. The first circuit further includes a second transistor having a second dopant type opposite to the first dopant type, wherein the second transistor is connected in series with the first transistor. The first circuit includes a second cascode transistor having the second dopant type, wherein the second cascode transistor is connected in series with the second transistor. The integrated circuit further includes a first bias circuit configured to adjust a threshold voltage of at least one of the first cascode transistor or the second cascode transistor.

Another aspect of this description relates to an integrated circuit including a first circuit. The first circuit includes a first transistor having a first dopant type. The first circuit further includes a first cascode transistor having the first dopant type, wherein the first cascode transistor connected in series with the first transistor. The first circuit further includes a second transistor having a second dopant type opposite to the first dopant type, wherein the second transistor is connected in series with the first transistor. The first circuit includes a second cascode transistor having the second dopant type, wherein the second cascode transistor is connected in series with the second transistor. The integrated circuit further includes a first bias circuit configured to adjust a threshold voltage the first cascode transistor. The first bias circuit includes a first bias transistor having the second dopant type. The first bias circuit further includes a second bias transistor having the second dopant type, wherein the second bias transistor is connected in series with the first bias transistor, and a node between the first bias transistor and the second bias transistor is connected to a bulk of the first cascode transistor.

Still another aspect of this description relates to an integrated circuit. The integrated circuit includes a first circuit. The first circuit includes a first transistor having a first dopant type. The first circuit further includes a first cascode transistor having the first dopant type, wherein the first cascode transistor connected in series with the first transistor, and a gate of the first cascode transistor is connected to a gate of the first transistor. The first circuit further includes a second transistor having a second dopant type opposite to the first dopant type, wherein the second transistor is connected in series with the first transistor. The first circuit further includes a second cascode transistor having the second dopant type, wherein the second cascode transistor is connected in series with the second transistor, and a gate of the second cascode transistor is connected to a gate of the second transistor. The integrated circuit further includes a first bias circuit configured to adjust a threshold voltage the first cascode transistor. The first bias circuit includes a first bias transistor having the second dopant type. The first bias circuit further includes a second bias transistor having the second dopant type, wherein the second bias transistor is connected in series with the first bias transistor, and a node between the first bias transistor and the second bias transistor is connected to a bulk of the first cascode transistor.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit comprising:
a first circuit, the first circuit comprising:
   a first transistor having a first dopant type;
   a first cascode transistor having the first dopant type, wherein the first cascode transistor connected in series with the first transistor, and a gate of the first transistor is connected to a gate of the first cascode transistor;
   a second transistor having a second dopant type opposite to the first dopant type, wherein the second transistor is connected in series with the first transistor, and a gate of the second transistor is configured to receive a first input signal;
   a second cascode transistor having the second dopant type, wherein the second cascode transistor is connected in series with the second transistor; and
   a third transistor having the second dopant type, wherein a source of the third transistor is connected to a source of the second transistor, and a gate of the third transistor is configured to receive a second input signal different from the first input signal; and
a first bias circuit configured to adjust a threshold voltage of at least one of the first cascode transistor or the second cascode transistor.

2. The integrated circuit of claim 1, further comprising a second bias circuit configured to adjust a threshold voltage of the second cascode transistor, wherein the first bias circuit is configured to adjust the threshold voltage of the first cascode transistor.

3. The integrated circuit of claim 1, wherein the first bias circuit comprises:
a first bias transistor having the second dopant type;
a second bias transistor having the second dopant type, wherein the second bias transistor is connected in series with the first bias transistor, and a node between the first bias transistor and the second bias transistor is connected to a bulk of the first cascode transistor.

4. The integrated circuit of claim 1, wherein a gate of the first transistor is electrically separated from a gate of the second transistor.

5. The integrated circuit of claim 1, wherein a gate of the second transistor is connected to a gate of the second cascode transistor.

6. The integrated circuit of claim 1, further comprising a resistor between the second transistor and a ground voltage, wherein the second transistor is between the resistor and the second cascode transistor.

7. The integrated circuit of claim 1, further comprising:
a fourth transistor having the first dopant type; and
a fourth cascode transistor having the first dopant type, wherein the fourth cascode transistor is connected in series with the fourth transistor, wherein a gate of the fourth transistor and a gate of the fourth cascode transistor are connected to a gate of the first transistor and a gate of the first cascode transistor.

8. The integrated circuit of claim 7, further comprising:
a fifth transistor having the second dopant type; and
a fifth cascode transistor having the second dopant type, wherein the fifth cascode transistor is connected in series with the fifth transistor, and a gate of the fifth cascode transistor is connected to a gate of the second cascode transistor.

9. The integrated circuit of claim 8, wherein a gate of the fifth transistor is connected to the gate of the fourth cascode transistor.

10. The integrated circuit of claim 8, wherein the first bias circuit is configured to adjust the threshold voltage of the second cascode transistor and a threshold voltage of the fifth cascode transistor.

11. The integrated circuit of claim 7, wherein the first bias circuit is configured to adjust the threshold voltage of the first cascode transistor and a threshold voltage of the fourth cascode transistor.

12. An integrated circuit comprising:
a first circuit, the first circuit comprising:
a first transistor having a first dopant type;
a first cascode transistor having the first dopant type, wherein the first cascode transistor connected in series with the first transistor, and a gate of the first transistor is connected to a gate of the first cascode transistor;
a second transistor having a second dopant type opposite to the first dopant type, wherein the second transistor is connected in series with the first transistor;
a second cascode transistor having the second dopant type, wherein the second cascode transistor is connected in series with the second transistor;
a diode-connected transistor having the second dopant type, wherein a gate of the diode-connected transistor is connected to a gate of the second cascode transistor; and
a third cascode transistor having the second dopant type, wherein the third cascode transistor is connected in series with the diode-connected transistor, and a gate of the third cascode transistor is connected to the gate of the diode-connected transistor; and
a first bias circuit configured to adjust a threshold voltage the first cascode transistor, wherein the first bias circuit comprises:
a first bias transistor having the second dopant type; and
a second bias transistor having the second dopant type, wherein the second bias transistor is connected in series with the first bias transistor, and a node between the first bias transistor and the second bias transistor is connected to a bulk of the first cascode transistor.

13. The integrated circuit of claim 12, further comprising a second bias circuit configured to adjust a threshold voltage of the second cascode transistor, the second bias circuit comprising:
a third bias transistor having the first dopant type; and
a fourth bias transistor having the second dopant type, wherein the fourth bias transistor is connected in series with the third bias transistor, and a node between the third bias transistor and the fourth bias transistor is connected to a bulk of the second cascode transistor.

14. The integrated circuit of claim 12, wherein a gate of the first transistor is connected to a drain of the first cascode transistor.

15. The integrated circuit of claim 12, further comprising:
a fourth transistor having the first dopant type; and
a fourth cascode transistor having the first dopant type, wherein the fourth cascode transistor is connected in series with the fourth transistor, wherein a gate of the fourth transistor and a gate of the fourth cascode transistor are connected to a gate of the first transistor and a gate of the first cascode transistor.

16. The integrated circuit of claim 15, further comprising:
a fifth transistor having the second dopant type; and
a fifth cascode transistor having the second dopant type, wherein the fifth cascode transistor is connected in series with the fifth transistor, and a gate of the fifth cascode transistor is connected to a gate of the second cascode transistor.

17. The integrated circuit of claim 16, wherein a gate of the fifth transistor is connected to the gate of the fifth cascode transistor.

18. The integrated circuit of claim 15, wherein the first bias circuit is configured to adjust a threshold voltage of the fourth cascode transistor.

19. An integrated circuit comprising:
a first circuit, the first circuit comprising:
a first transistor having a first dopant type;
a first cascode transistor having the first dopant type, wherein the first cascode transistor connected in series with the first transistor, and a gate of the first cascode transistor is connected to a gate of the first transistor;
a second transistor having a second dopant type opposite to the first dopant type, wherein the second transistor is connected in series with the first transistor;
a second cascode transistor having the second dopant type, wherein the second cascode transistor is connected in series with the second transistor, and a gate of the second cascode transistor is connected to a gate of the second transistor;
a third cascode transistor having the first dopant type, wherein a gate of the third cascode transistor is connected to the gate of the first cascode transistor; and a fourth cascode transistor having the first dopant type, wherein a gate of the fourth cascode transistor is configured to receive a same voltage as the gate of the third cascode transistor; and a first bias circuit configured to adjust a threshold voltage the first cascode transistor, wherein the first bias circuit comprises:

a first bias transistor having the second dopant type; and a second bias transistor having the second dopant type, wherein the second bias transistor is connected in series with the first bias transistor, and a node between the first bias transistor and the second bias transistor is connected to a bulk of the first cascode transistor.

20. The integrated circuit of claim 19, further comprising a second bias circuit configured to adjust a threshold voltage of the second cascode transistor.

* * * * *